(12) United States Patent
Nicollini et al.

(10) Patent No.: US 8,947,278 B2
(45) Date of Patent: Feb. 3, 2015

(54) SINGLE-ENDED TO DIFFERENTIAL BUFFER CIRCUIT AND METHOD FOR COUPLING AT LEAST A SINGLE-ENDED INPUT ANALOG SIGNAL TO A RECEIVING CIRCUIT WITH DIFFERENTIAL INPUTS

(75) Inventors: Germano Nicollini, Piancenza (IT); Alberto Minuti, Piacenza (IT); Marco Zamprogno, Monza e Brianza (IT)

(73) Assignee: ST-Ericsson SA, Plan-les-Ouates (CH)

( * ) Notice: Subject to any disclaimer, the term of this patent is extended or adjusted under 35 U.S.C. 154(b) by 15 days.

(21) Appl. No.: 13/822,347

(22) PCT Filed: Sep. 8, 2011

(86) PCT No.: PCT/EP2011/065562

§ 371 (c)(1), (2), (4) Date: May 7, 2013

(87) PCT Pub. No.: WO2012/041681

PCT Pub. Date: Apr. 5, 2012

(65) Prior Publication Data

US 2013/0214948 A1 Aug. 22, 2013

Related U.S. Application Data

(60) Provisional application No. 61/405,783, filed on Oct. 22, 2010.

(30) Foreign Application Priority Data

Sep. 30, 2010 (EP) .................................... 10183195

(51) Int. Cl.
*H03M 3/00* (2006.01)
*H03M 1/12* (2006.01)
(Continued)

(52) U.S. Cl.
CPC ............. *H03M 1/124* (2013.01); *G11C 27/026* (2013.01); *H03F 3/45475* (2013.01);

(58) Field of Classification Search
CPC ....... H03F 1/223; H03F 3/45188; H03M 1/12

USPC ................................................... 341/155, 143
See application file for complete search history.

(56) References Cited

U.S. PATENT DOCUMENTS 5,220,286 A 6/1993 Nadeem
(Continued)

FOREIGN PATENT DOCUMENTS

EP 0 483 419 A1 5/1992

OTHER PUBLICATIONS

International Search Report issued in corresponding International application No. PCT/EP2011/065562, date of mailing Dec. 21, 2011.
(Continued)

*Primary Examiner* — Brian Young
(74) *Attorney, Agent, or Firm* — Patent Portfolio Builders PLLC

(57) ABSTRACT

A single-ended to differential buffer circuit is disclosed, adapted to couple at least an input analog signal to a receiving circuit. The buffer circuit comprises an output section comprising a differential amplifier having a first and a second input, a first and a second output. The buffer circuit further comprises an input section comprising a first and a second switched capacitor, each adapted to sample said input analog signal and having a first side and a second side, the first sides of the first and second switched capacitors being controllably connectable/disconnectable to/from said first and second outputs respectively. In the buffer circuit the second sides of said first and second switched capacitors are controllably connectable/disconnectable to/from said first and second inputs of the differential amplifier respectively. Moreover, in the buffer circuit the second sides of the first and second switched capacitors are controllably connectable/disconnectable to/from said second output and said first output respectively. A method for coupling at least a single-ended input analog signal to a receiving circuit with differential inputs is also disclosed.

16 Claims, 3 Drawing Sheets

(51) Int. Cl.
*G11C 27/02* (2006.01)
*H03F 3/45* (2006.01)

(52) U.S. Cl.
CPC .. *H03F 3/45986* (2013.01); *H03F 2203/45512* (2013.01); *H03F 2203/45536* (2013.01)
USPC .......................................... 341/143; 341/155

(56) References Cited

U.S. PATENT DOCUMENTS

| | | | |
|---|---|---|---|
| 6,031,399 A | 2/2000 | Vu et al. | |
| 6,169,427 B1 * | 1/2001 | Brandt | 327/94 |
| 7,397,287 B2 | 7/2008 | Makihara | |
| 7,538,618 B2 * | 5/2009 | Park et al. | 330/301 |
| 7,843,232 B2 * | 11/2010 | Farhat et al. | 327/91 |
| 7,852,252 B2 * | 12/2010 | Ge et al. | 341/155 |
| 8,306,494 B2 * | 11/2012 | Ojo | 455/248.1 |
| 2006/0164279 A1 | 7/2006 | Brewer et al. | |
| 2008/0094272 A1 | 4/2008 | Horie | |
| 2009/0212830 A1 | 8/2009 | Zamprogno et al. | |
| 2010/0219864 A1 | 9/2010 | Farhat et al. | |

OTHER PUBLICATIONS

"Data Conversion Products," National Semiconductors Corporation 2006.

Fujimori, Ichiro et al., "A 1.5V, 4.1 mW Dual-Channel Audio Delta-Sigma D/A Converter," IEEE Journal of Solid-State Circuits, vol. 33, No. 12, pp. 1863-1870, Dec. 1998.

* cited by examiner

SINGLE-ENDED TO DIFFERENTIAL BUFFER CIRCUIT AND METHOD FOR COUPLING AT LEAST A SINGLE-ENDED INPUT ANALOG SIGNAL TO A RECEIVING CIRCUIT WITH DIFFERENTIAL INPUTS

TECHNICAL FIELD

The present disclosure relates to a buffer circuit, in particular to a single-ended to differential buffer circuit, and to a method for coupling at least a single-ended input analog signal to a receiving circuit with differential inputs.

BACKGROUND ART

In many applications there is the need to measure one or, usually, more single ended analog signals having relatively high source impedances. This is for example the case of mobile terminals, where there is the need to measure several operating parameters, such as the charge level of the battery, the temperature of the battery, the status of the connection to an external device, etc. Usually the analog signals that have to be measured are low frequency signals (for example from 0 to 500 Hz). A general purpose ADC (in short GPADC) is often used to convert the above mentioned signals from the analog to the digital domain while measuring them. In the latter case, the above conversion should be performed on the whole input signal dynamic range with the maximum accuracy of the ADC, i.e. with very low offset and gain error and low non-linearity errors (usually indicated with the acronyms INL—Integral Non Linearity—and DNL—Differential Non Linearity).

U.S. Pat. No. 7,397,287 discloses a sample hold circuit which can convert a single-ended signal into a differential signal intended to be fed to a differential analog to digital converter. The above indicated sample and hold circuit, which performs the function of an input buffer, comprises a differential operational amplifier, a first set of capacitors provided on an inverting side of the operational amplifier and a second set of capacitors provided on a non-inverting side of the operational amplifier. In the sample and hold circuit of U.S. Pat. No. 7,397,287 there is the need of keeping the operational amplifier in the ON state during the track-and-hold phase of the input signal. Moreover, if there is the need of managing more input signals to be provided to the analog to digital converter, the circuit of U.S. Pat. No. 7,397,287 must be replicated for each of said signals, thus requiring a significant increase in the area occupation.

SUMMARY OF THE INVENTION

In view of the above described problems, it is an object of the present invention is to provide a high input single-ended to differential buffer which is adapted to couple at least a single-ended input analog signal to a receiving circuit with differential inputs and which does not require the differential amplifier to be in power ON state during the sampling of the input signal.

The single-ended to differential buffer circuit comprises an output section comprising a differential amplifier having a first and a second input, a first and a second output. The single-ended to differential buffer circuit comprises an input section comprising a first and a second switched capacitor, each adapted to sample the input analog signal and having a first side and a second side, the first sides of the first and second switched capacitors being controllably connectable/disconnectable to/from said first and second outputs respectively. The second sides of the first and second switched capacitors are controllably connectable/disconnectable to/from the first and second inputs of the differential amplifier respectively. The second sides of the first and second switched capacitors are controllably connectable/disconnectable to/from said second output and said first output respectively.

According to an embodiment, by providing a plurality of dedicated input sections of the above described kind, each associated to a respective input analog signal, adapted to be selectively connected to a temporally shared output section of the above described kind, it is possible to provide a multi-input single ended to differential buffer circuit which does not require a significant increase in the area occupation, because it does not need a differential amplifier for each of the input analog single-ended signals to be coupled to the receiving circuit.

A further object of the present invention is to provide a method for coupling at least a single-ended input analog signal to a receiving circuit with differential inputs, by means of an output section comprising a differential amplifier having a first and second input and a first and second output and by means of an input circuit section, associated to said single ended input analog signal, comprising a first and a second switched capacitor. The method comprises a step of sampling said input signal by controllably connecting said capacitors between a first node fed with said input signal and a second node fed with a reference voltage or connected to ground. The sampling step is such to establish an initial charge on said capacitors. The method comprises a subsequent step of connecting the first switched capacitor between said first input and said first output and connecting the second switched capacitor between said second input and said second output. The method comprises a subsequent step of restoring the initial charge on the switched capacitors by connecting said capacitors between said first output and said second output of the differential amplifier.

According to an embodiment, by providing a plurality of dedicated input sections of the above described kind, each associated to a respective input analog signal, and selectively connecting such input sections to a temporally shared output section of the above described kind, it is possible to provide a method that is adapted to couple a plurality of input single-ended analog signals to a receiving circuit with differential inputs and which can be implemented with a circuit which does not require a significant increase in the area occupation.

BRIEF DESCRIPTION OF THE DRAWINGS

Further features and advantages of the present invention will become more apparent from the following detailed description of exemplary but non-limiting embodiments thereof, as illustrated in the attached figures, in which.

DETAILED DESCRIPTION

In the attached figures identical or similar elements will be indicated with the same reference numbers/symbols.

Figure 1:
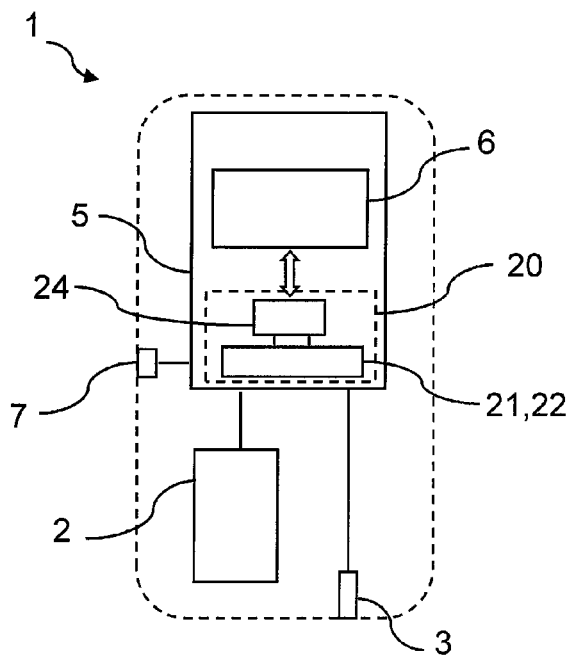
FIG. 1 shows a very simplified schematic view of a mobile terminal.

FIG. 1 illustrates a very schematic view of an embodiment of mobile terminal 1, such as for example a mobile phone, comprising a circuit system 20. The circuit system 20 comprises a single-ended to differential buffer circuit 21, 22 adapted to couple at least a single-ended analog signal to a receiving circuit 24 with differential inputs. In the particular example shown, the receiving circuit 24 is for example, and without for this reason introducing any limitation, a fully differential general purpose analog to digital converter (GPADC) operating at a prescribed sampling frequency.

According to an embodiment, the at least one single-ended analog signal comprises a plurality of slowly varying single-ended analog signals to be selectively coupled to the above mentioned GDADC 24. As far as the present description is concerned, the expression slowly varying analog signal has to be interpreted with the meaning that the analog signal has a maximum frequency significantly lower than the operating frequency of the GPADC 24 or in general the operating frequency of the receiving circuit 24. According to an embodiment, said maximum frequency is lower than 1/10 of the above mentioned operating frequency. According to a further embodiment, said maximum frequency is lower than 1/100 of the above mentioned operating frequency. According to a possible embodiment the above maximum frequency is 500 Hz.

According to an embodiment, the mobile terminal 1 comprises a circuit board 5 comprising a control and processing unit 6 coupled to the circuit system 20, and more in particular to the GPADC 24. The control and processing unit 6 is adapted to receive from the latter digital samples of the analog input signals and to process said signals for controlling the operation of the mobile terminal 1. According to an exemplary embodiment, the control and processing unit 6 on the basis of the above mentioned digital samples is such to detect the status of an USB interface 7 of the mobile terminal 1, to monitor the status of charge and the temperature of a battery 2 of the mobile terminal 1, to monitor the status of an external accessory of the mobile terminal 1, such for example an earphone or a battery charger removably connectable to a dedicated connection port 3 of the mobile terminal 1. It is therefore clear that a plurality of input single-ended analog signal have to be selectively fed to the GPADC 24. In general, in typical applications related to mobile terminals there is the need of coupling up to ten or fifteen input single-ended signals to the differential GPADC 24. In general, such signals come from sources having relatively high output impedances.

As the general structure and the operation of a mobile terminal, such for example a mobile phone, are well known to a man skilled in the field, for sake of conciseness they will be not further detailed in the present description. On the contrary, the following description will be mainly focused on the circuit system 20 and in particular on the single-ended to differential buffer circuit 21,22. It is important to remark the single-ended to differential buffer circuit 21,22 of the foregoing description can be also employed in systems and and/or devices different from a mobile terminal 1, for example in products that contrary to mobile terminals don't have or require any remote connectivity, as it can be in general employed whenever there is the need of coupling at least one single-ended analog signal to a differential inputs receiving circuit.

Figure 2:
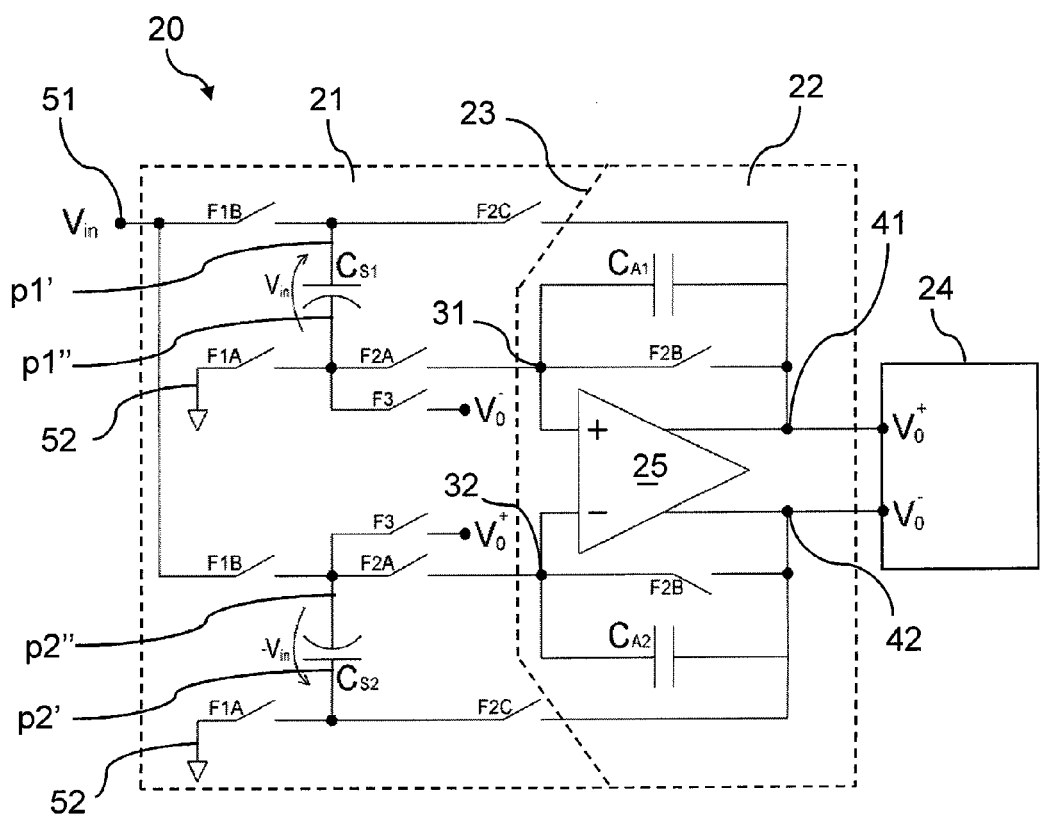
FIG. 2 shows a schematic diagram of a first embodiment of circuit system comprising a single-ended to differential buffer circuit having an input section and an output section.

FIG. 2 shows a first embodiment of circuit system 20 comprising a single-ended to differential buffer circuit 21, 22 adapted to couple one single-ended input analog signal $V_{in}$ to a receiving circuit 24 with differential inputs, such as the GPADC 24 of the mobile terminal 1 of FIG. 1. The input analog signal is a slowly varying analog signal. The particular example of buffer circuit 21, 22 of FIG. 2 is adapted to couple only one single-ended input analog signal $V_{in}$ to the GPADC 20, but later in the description a different embodiment of circuit system will be also disclosed comprising a single-ended to differential buffer that is adapted to selectively couple a plurality of single-ended analog input signals to the same receiving circuit 24.

With reference to FIG. 2, the single-ended to differential buffer circuit 21, 22 comprises an output section 22 comprising a differential amplifier 25 having a first 31 and a second 32 input, a first 41 and a second 42 output. The first and second outputs are adapted to be connected to the receiving circuit 24. According to the embodiment shown, the differential amplifier 25 is a resettable amplifier, to this end the output section 22 comprises a set, and in particular a couple, of controllable switches F2B. Such switches F2B are such to connect/disconnect the first input 31 to/from the first output 41 and to connect/disconnect the second input 32 to/from the second output 42.

According to an actually preferred, but not for this reason limiting, embodiment the output section 22 further comprises a first and a second feedback capacitors $C_{A1}$, $C_{A2}$ respectively connected between the first input 31 and the first output 41 and between the second input 32 and the second output 42.

The single-ended to differential buffer circuit 20, comprises an input section 21 comprising a first $C_{S1}$ and a second $C_{S2}$ switched capacitor, each adapted to sample the input analog signal $V_{in}$. In particular, the first switched capacitor $C_{S1}$ is adapted to sample the signal $V_{in}$ and the second capacitor is adapted to sample the same signal as $-V_{in}$. In FIG. 2 the input section 21 and the output section 22 have been shown separated by the dotted line 23.

Each switched capacitor $C_{S1}$, $C_{S2}$ has a first side p1',p2' and a second side p1",p2". The input section comprises a first 51 and second 52 input node for receiving respectively the input analog signal $V_{in}$ and a reference voltage signal or ground. In the particular example shown in FIG. 2, the second input node 52 is connected to ground.

The first sides p1', p2' of the first and second switched capacitors $C_{S1}$, $C_{S2}$ are controllably connectable/disconnectable to/from the first 41 and second 42 outputs of the differential amplifier 25 respectively. To this end, a set, and in particular a couple, of dedicated controllable switches F2C is provided in the input section 21. The second sides p1", p2" of the first $C_{S1}$ and second $C_{S2}$ switched capacitors are controllably connectable/disconnectable to/from the first 31 and second 32 inputs of the differential amplifier 25 respectively. To this end, a set, and in particular a couple, of dedicated controllable switches F2A is provided in the input section 21. Moreover, the second sides p1", p2" of the first and second switched capacitors $C_{S1}$, $C_{S2}$ are controllably connectable/disconnectable to/from the second output 42 and the first output 41 respectively. To this end, a set, and in particular a couple, of dedicated controllable switches F3 is provided in the input section 21. It is important to observe that the sets of switches F2C and F3 when are all in the closed state are such to connect each of the switched capacitors $C_{S1}$, $C_{S2}$ between the first 41 and the second 42 output of the differential amplifier 25.

According to the embodiment shown in FIG. 2, the first side p1' of the first switched capacitor $C_{S1}$ is controllably connectable/disconnectable to/from the first input node 51 while the first side p2' of the second switched capacitor $C_{S2}$ is controllably connectable/disconnectable to/from the second input node 52. To this end, a set, and in particular a couple, of dedicated controllable switches F1B and F1A is provided in the input section 21.

Moreover, according to the embodiment shown in FIG. 2, the second side p1" of the first switched capacitor $C_{S1}$ is controllably connectable/disconnectable to/from the second input node 52 while the second side p2" of the second switched capacitor $C_{S2}$ is controllably connectable/disconnectable to/from the first input node 51. To this end, a set, and in particular a couple, of dedicated controllable switches F1A and F1B is provided in the input section 21.

The single-ended to differential buffer circuit 21, 22 is adapted to assume in sequence:

a sampling operating configuration in which each of the switched capacitors $C_{S1}$, $C_{S2}$ is connected between the first input node 51 and the second input node 52 and therefore is adapted to be charged with an initial charge (switches F1A, F1B and F2B in the closed state, switches F2A, F2C and F3 in the open state);

a storing operating configuration in which the first switched capacitor $C_{S1}$ is connected between the first input 31 and the first output 41 and in which the second switched capacitor $C_{S2}$ is connected between the second input 32 and the second output 42 (switches F2A and F2C in the closed state, switches F1A, F1B, F2B and F3 in the open state);

a charge restoring configuration in which each of the switched capacitors $C_{S1}$, $C_{S2}$ is connected between the first output 41 and the second output 42 in order to restore on said capacitors $C_{S1}$, $C_{S2}$ the initial charge (switches F2C and F3 in the closed state, and switches F1A, F1B and F2B in the open state).

Figure 3:
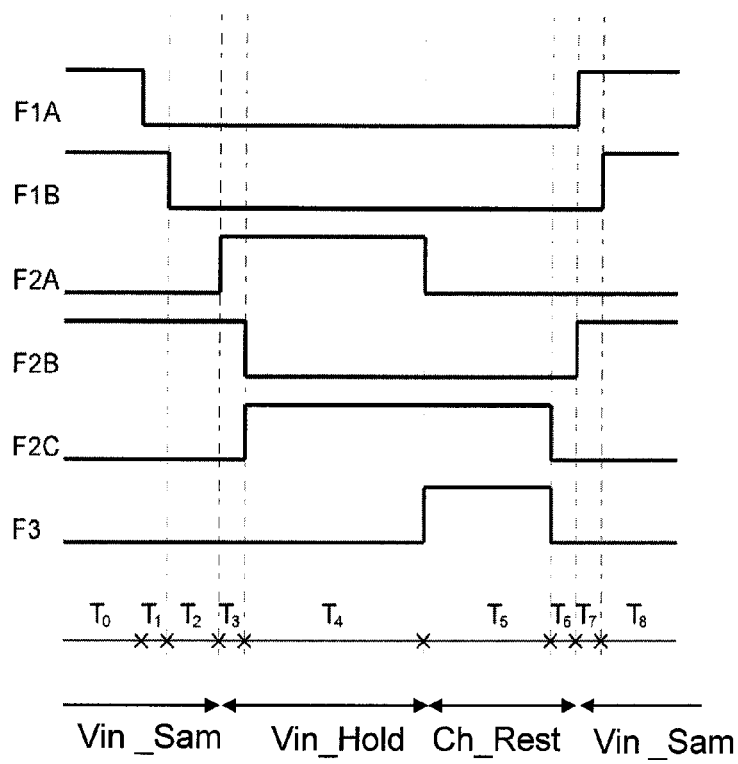
FIG. 3 shows a schematic time diagram representing the operation of switching circuitry comprised in the single-ended to differential buffer circuit of FIG. 2.

With reference to FIGS. 2 and 3 the operation of the above described single-ended to differential input buffer 21, 22 will be described hereunder.

In FIG. 3 $T_0$ indicates a time interval corresponding to an arbitrary initial condition. During interval $T_0$ the switched capacitors $C_{S1}$, $C_{S2}$ sample the input signal $V_{in}$. In particular, $C_{S1}$ samples a voltage $V_{in}$ and $C_{S2}$ samples the same voltage but as $-V_{in}$. The differential amplifier 25 is reset. During $T_0$ due to the voltages $V_{in}$, and $-V_{in}$ the switched capacitors $C_{S1}$, $C_{S2}$ are charged to a given charge that we will indicate as "initial charge". During $T_0$ switches F1A, F1B and F2B in the closed state while switches F2A, F2C and F3 in the open state. If $V_{cm}$ is the common mode voltage of the differential amplifier 25, the output voltage $V_o$ of the amplifier 25 is $V_o = V_o^+ - V_o^- = V_{cm} - V_{cm} = 0$ V, where $V_o^+$ is the voltage of the first output 41 and $V_o^-$ is the voltage of the second output 42.

Starting from the above described configuration during interval $T_0$, at the beginning of interval $T_1$ switches F1A become open, and voltages $V_{in}$ and $-V_{in}$ remain stored on switched capacitors $C_{S1}$ and $C_{S2}$ respectively. In this way, signal dependent charge injection is avoided, at least at first order. The differential amplifier 25 is reset and the output voltage $V_o$ of the amplifier 25 is $V_o = V_o^+ - V_o^- = V_{cm} - V_{cm} = 0$ V.

Starting from the above described configuration during interval $T_1$, at the beginning of interval $T_2$ switches F1B become open. Accordingly the switched capacitors $C_{S1}$ and $C_{S2}$ become fully floating. Voltages $V_{in}$ and $-V_{in}$ remain stored on switched capacitors $C_{S1}$ and $C_{S2}$ respectively. The differential amplifier 25 is reset and the output voltage $V_o$ of the amplifier 25 is $V_o = V_o^+ - V_o^- = V_{cm} - V_{cm} = 0$ V.

Starting from the above described configuration during interval $T_2$, at the beginning of interval $T_3$ switches F2A become closed. Accordingly, the second sides p1" and p2" of the switched capacitors $C_{S1}$ and $C_{S2}$ are respectively connected to the first input 31 and the second input 32 of the differential amplifier 25, such sides becoming therefore charged to $V_{cm}$. The differential amplifier 25 is reset and the output voltage $V_o$ of the amplifier 25 is $V_o = V_o^+ - V_o^- = V_{cm} - V_{cm} = 0$ V.

Starting from the above described configuration during interval $T_3$, at the beginning of interval $T_4$, switches F2B become open while switches F2C become closed. If all the capacitors $C_{S1}$, $C_{S2}$, $C_{A1}$, $C_{A2}$ have the same capacitance the output voltage of the amplifier 25 is $V_o = V_{in}$. Without the capacitors $C_{A1}$ and $C_{A2}$, which are optional, $V_o$ would be $2*V_{in}$. It is therefore clear that the feedback switches $C_{A1}$, $C_{A2}$ perform a required attenuation, for example in the case in which the output voltage $V_o$ might not be within the amplifier's output voltage range. During interval $T_4$ the output voltage $V_o$ can be sampled by the differential GPADC 24.

Starting from the above described configuration during interval $T_4$, at the beginning of interval $T_5$ switches F2A become open and switches F3 become closed. Each switched capacitor $C_{S1}$, $C_{S2}$ is therefore connected between the first 41 and second 42 outputs of the differential amplifier 25. This configuration is such to restore on switched capacitors $C_{S1}$, $C_{S2}$ their initial charges.

Starting from the above described configuration during interval $T_5$, at the beginning of interval $T_6$ switches F2C and F3 become open, therefore the switched capacitors $C_{S1}$, $C_{S2}$ become fully floating with the same initial charge that they had during interval $T_0$ (i.e. the charge determined by $V_{in}$ on $C_{S1}$ and $-V_{in}$ on $C_{S2}$).

Starting from the above described configuration during interval $T_6$, at the beginning of interval $T_7$ switches F1A and F2B become closed. The differential amplifier 25 is reset and the output voltage Vo of the amplifier 25 is $V_o = V_o^+ - V_o^- = V_{cm} - V_{cm} = 0$ V.

Starting from the above described configuration during interval $T_7$, at the beginning of interval $T_8$ switches F1B become closed. The single ended to differential buffer circuit 21, 22 reaches therefore the same configuration of time period $T_0$. Accordingly, the switched capacitors $C_{S1}$ and $C_{S2}$ are restored to their initial sampling configuration. The differential amplifier 25 is reset and the output voltage $V_o$ of the amplifier 25 is $V_o = V_o^+ - V_o^- = V_{cm} - V_{cm} = 0$ V.

It is clear from the above description of the operation of the single-ended to differential buffer circuit 21, 22, that if the analog input signal $V_{in}$ is slowly varying, the amount of charge on the switched capacitors $C_{S1}$ and $C_{S2}$ is almost the same in the beginning and final configurations (corresponding respectively to the ones of time intervals $T_0$ and $T_8$). Therefore, almost no charge transfer, i.e. current, is needed from the input signal $V_{in}$. This means that the single-ended to differential buffer circuit 21, 22 is characterized by an high input impedance.

Figure 5:
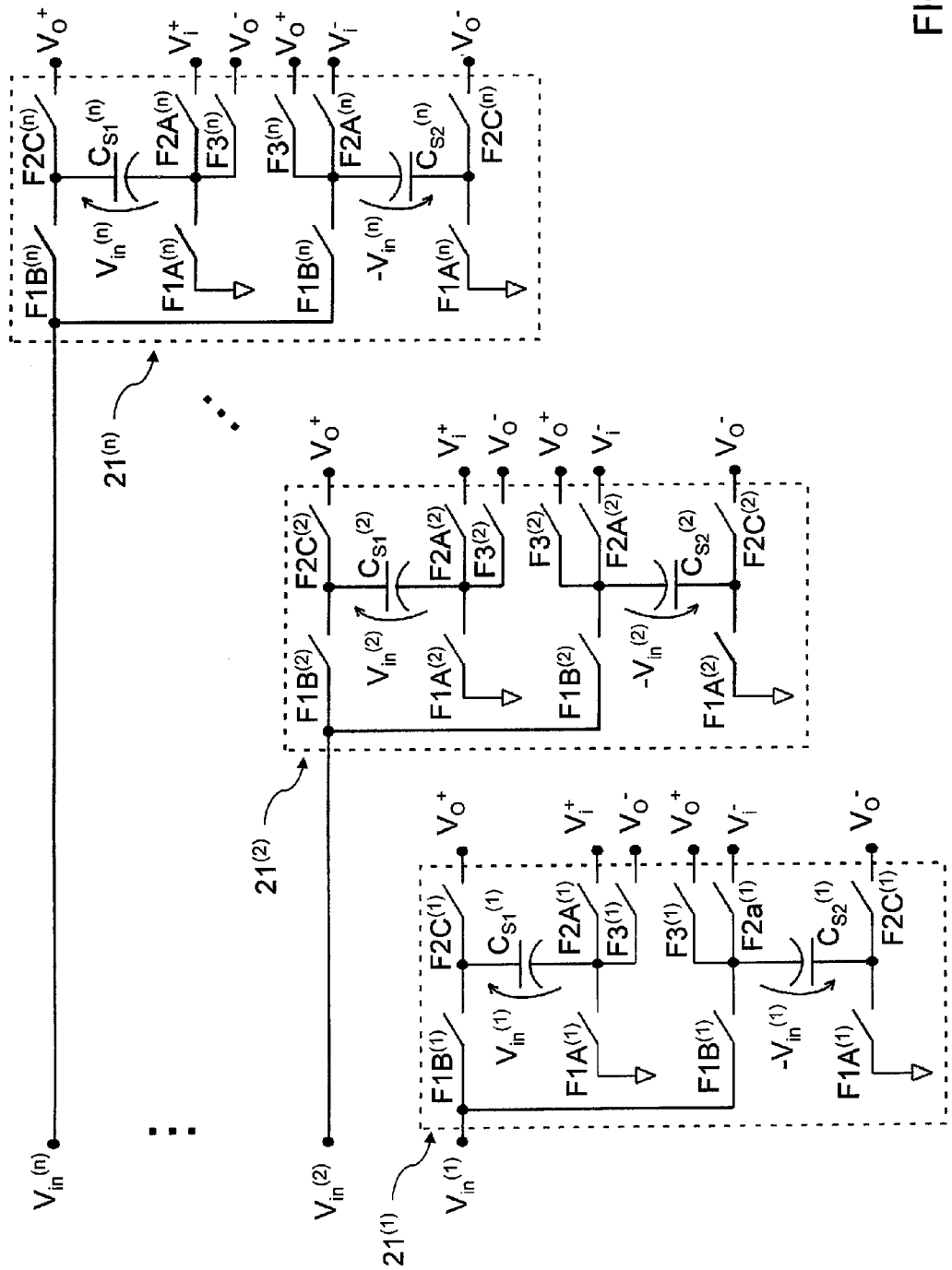
FIG. 5 shows a variant embodiment of the input section of FIG. 2.

FIG. 5 shows a partial view of a variant embodiment of the input section of FIG. 2, in which the input section 21 of FIG. 2 has been replaced by a plurality of input sections $21^{(1)}$, $21^{(2)}$, ..., $21^{(n)}$ similar to the input section 21 of FIG. 2, each dedicated to an associated input single-ended analog signal $V_{in}^{(1)}$, $V_{in}^{(2)}$, ..., $V_{in}^{(n)}$ to be selectively coupled, one at time, to a same receiving circuit 24 with differential inputs. It is important to remark that said input sections $21^{(1)}$, $21^{(2)}$, ..., $21^{(n)}$ can be selectively and in a mutually exclusive way activated in order to cooperate with a same output section 22 similar to the one already described with reference to FIG. 2. In this way, it is advantageously possible to design a multi-input single-ended to differential buffer which, requiring only one shared differential amplifier 25, does not require a significant increase in the occupied area compared to the single input embodiment.

Figure 4:
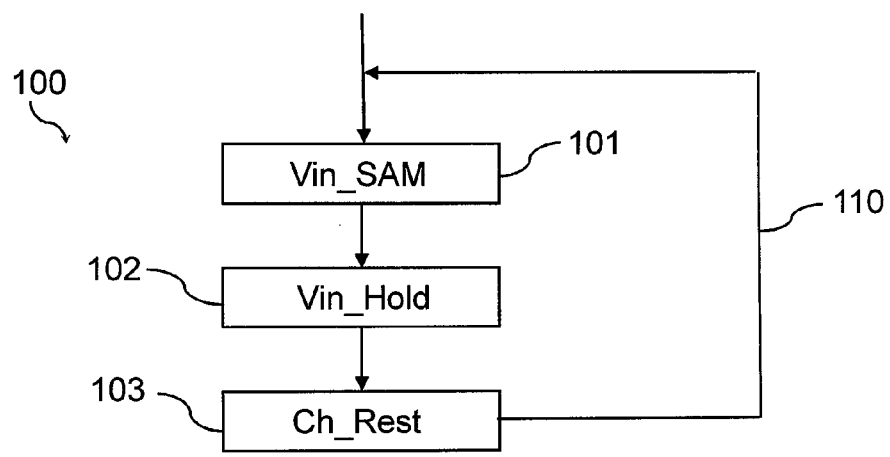
FIG. 4 shows a simplified flow chart of method for coupling at least a single-ended input analog signal to a receiving circuit with differential inputs.

With reference to FIGS. 3 and 4, it must be observed that the above description of the operation of the single-ended to differential buffer circuit 21, 22 corresponds to the description of a method 100 for coupling at least a single-ended input analog signal $V_{in}$, and in particular a slowly varying signal, to a receiving circuit 24 with differential inputs, by means of:

an output section 22 comprising a differential amplifier 25 having a first 31 and second 32 input and a first 41 and second 42 output; and an input circuit section 21, associated to said single ended input analog signal $V_{in}$, comprising a first $C_{S1}$ and a second $C_{S2}$ switched capacitor.

The method 100 comprises in sequence the steps of:

Vin_Sam—time periods $T_0$, $T_1$, $T_2$, $T_7$ (the latter as a preliminary period to the actual sampling operation), $T_8$—sampling 101 the input signal $V_{in}$ by controllably connecting the switched capacitors $C_{S1}$, $C_{S2}$ between a first node 51 fed with the input signal $V_{in}$ and a second node 52 fed with a reference voltage or connected to ground, the sampling step 101 being such to establish an initial charge on the switched capacitors $C_{S1}$, $C_{S2}$;

Vin_Hold—time periods $T_3$ and $T_4$—connecting 102 the first switched capacitor $C_{S1}$ between the first input 31 and the first output 41 and connecting 102 the second switched capacitor $C_{S2}$ between the second input 32 and the second output 42;

Ch_Rest—time periods $T_5$, $T_6$—restoring 103 the initial charge on switched capacitors $C_{S1}$, $C_{S2}$ by connecting said capacitors between the first output 41 and the second 42 output.

As indicated in FIG. 4 by the arrow 110, after the restoring step 103, the sampling 101, connecting 102 and restoring step 103 can be cyclically performed.

The sampling step 101 (Vin_Sam) comprises:

a first operation of connecting the switched capacitors $C_{S1}$, $C_{S2}$ to the second node 52;

a second operation of connecting the switched capacitors $C_{S1}$, $C_{S2}$ to the first node 51;

a third operation of disconnecting the first and second switched capacitors $C_{S1}$, $C_{S2}$ from nodes 51, 52 leaving said switched capacitors $C_{S1}$, $C_{S2}$ floating;

said first, second and third operations of the sampling step 101 being performed in sequence.

According to an embodiment, the above mentioned third operation comprises:

a first sub-operation of disconnecting the switched capacitors $C_{S1}$, $C_{S2}$ from the second node 52;

a second subsequent sub-operation of disconnecting said capacitors $C_{S1}$, $C_{S2}$ from the first node 51.

According to an embodiment, the connecting step 102 (Vin_hold) comprises a first operation of connecting the second sides p1″, p2″ of the switched capacitors $C_{S1}$, $C_{S2}$ to the inputs 31, 32 of the differential amplifier 25 and a second operation of connecting the first sides p1′, p2′ of said capacitors to the outputs 41, 42 of the differential amplifier 25. The first and second operations of the connecting step 102 are performed in sequence.

According to an embodiment, the charge restoring step 103 (Ch_Rest) comprises the operations of:

disconnecting the second side p1″ of the first switched capacitor $C_{S1}$ from the first input 31 and connecting it to the second output 42;

disconnecting the second side p2″ of the second switched capacitor $C_{S2}$ from the second input 32 and connecting it to the first output 41.

According to a variant embodiment, the method 100 is provided for selectively coupling a plurality of a single-ended input analog signals $V_{in}^{(1)}$, $V_{in}^{(2)}$, ..., $V_{in}^{(n)}$ to the receiving circuit 24. The input section 21 comprises a plurality of dedicated input sections $21^{(1)}$, $21^{(2)}$, ..., $21^{(n)}$ each associated to a corresponding input signal of said plurality. In this embodiment, the method 100 further comprises the step (not shown in the diagram of FIG. 4), of selectively activating said dedicated input sections $21^{(1)}$, $21^{(2)}$, ..., $21^{(n)}$ in a mutually exclusive way in order to making them cooperate, one at time, with the same, and therefore temporally shared, output section 22.

On the basis of the above disclosure, it can be seen how the objects of the present invention are fully reached. In particular, the above described buffer performs a single-ended to differential conversion, has a high input impedance and does not require the differential amplifier to be in the power ON state during the sampling step 101 (Vin_SAM). As already remarked, the multi-input embodiment is characterized by a relatively reduced area occupation.

Naturally, in order to satisfy contingent and specific requirements, a person skilled in the art may apply to the above-described single-ended to differential buffer many modifications and variations, all of which, however, are included within the scope of protection of the invention as defined by the following claims.

The invention claimed is:

1. A single-ended to differential buffer circuit, for coupling at least an input analog signal to a receiving circuit, the circuit comprising:

an output section comprising a differential amplifier having a first and a second input, a first and a second output; and an input section comprising a first and a second switched capacitor, each adapted to sample said input analog signal and having a first side and a second side, the first sides of the first and second switched capacitors being controllably connectable/disconnectable to/from said first and second outputs respectively, wherein:

the second sides of the first and second switched capacitors are controllably connectable/disconnectable to/from the first and second inputs of the differential amplifier respectively;

the second sides of the first and second switched capacitors are controllably connectable/disconnectable to/from said second output and said first output respectively.

2. The single-ended to differential buffer circuit according to claim 1, wherein:

the input section comprises a first and second input node for receiving respectively said input analog signal and a reference voltage signal or ground;

the first side of the first switched capacitor is controllably connectable/disconnectable to/from the first input node;

the second side of the first switched capacitor is controllably connectable/disconnectable to/from the second input node;

the first side of the second switched capacitor is controllably connectable/disconnectable to/from the second input node; and the second side of the second switched capacitor is controllably connectable/disconnectable to/from the first input node.

3. The single-ended to differential buffer circuit according to claim 2, wherein such circuit is adapted to assume in sequence:
   a sampling operating configuration in which each of said switched capacitors is connected between said first input node and said second input node and adapted to be charged with an initial charge;
   a storing operating configuration in which the first switched capacitor is connected between the first input and the first output and in which the second switched capacitor is connected between the second input and the second output; and
   a charge restoring configuration in which each of said switched capacitors is connected between said first output and said second output in order to restore on the switched capacitors said initial charge.

4. The single-ended to differential buffer circuit according to claim 1, wherein the output section further comprises a first and a second feedback capacitor respectively connected between said first input and said first output and said second input and said second output.

5. The single-ended to differential buffer circuit according to claim 1, wherein said buffer circuit is adapted to selectively couple a plurality of input analog signals to the receiving circuit, and wherein said buffer circuit comprises a plurality of said input sections each associated to a corresponding input signal of said plurality and each selectively connectable to said output section.

6. The single-ended to differential buffer circuit according to claim 2, comprising:
   a first set of controllable switches for connecting/disconnecting said switched capacitors to/from said first input node;
   a second set of controllable switches for connecting/disconnecting said first and second switched capacitors to/from said first and second outputs respectively;
   a third set of controllable switches for connecting/disconnecting said switched capacitors to/from said second input node;
   a fourth set of controllable switches for connecting/disconnecting said first and second switched capacitors to/from said first and second inputs respectively; and
   a fifth set of controllable switches for connecting/disconnecting, together with said second set of controllable switches, each of said switched capacitors between the first output and the second output.

7. A circuit system comprising a single-ended to differential buffer circuit according to claim 1 and comprising said receiving circuit, said receiving circuit being connected to said first and second outputs of the differential amplifier.

8. The circuit system according to claim 7, wherein said receiving circuit is an analog to digital converter.

9. A mobile terminal comprising a single-ended to differential buffer circuit according to claim 1.

10. A method for coupling at least a single-ended input analog signal to a receiving circuit with differential inputs, by means of a buffer circuit comprising:
    an output section comprising a differential amplifier having a first and second input and a first and second output; and
    at least one input circuit section, associated to said single ended input analog signal, comprising a first and a second switched capacitor;
    the method comprising in sequence the steps of:
    sampling said input signal by controllably connecting said capacitors between a first node fed with said input signal and a second node fed with a reference voltage or connected to ground, the sampling step being such to establish an initial charge on said capacitors;
    connecting the first switched capacitor between said first input and said first output and connecting the second switched capacitor between said second input and said second output; and
    restoring said initial charge on the switched capacitors by connecting said capacitors between said first output and said second output.

11. The method according to claim 10, wherein said sampling step comprises:
    a first operation of connecting the switched capacitors to said second node;
    a second operation of connecting the switched capacitors to said first node; and
    a third operation of disconnecting the first and second switched capacitors from said nodes leaving the switched capacitors floating;
    said first, second and third operations of the sampling step being performed in sequence.

12. The method according to claim 11, wherein said third operation comprises:
    a first sub-operation of disconnecting the switched capacitors from the second node; and
    a second subsequent sub-operation of disconnecting the switched capacitors from the first node.

13. The method according to claim 10, wherein each of said switched capacitors have a first side and a second side and wherein said connecting step comprises a first operation of connecting the second sides of said capacitors to said inputs and a second operation of connecting the first sides of said capacitors to said outputs, said first and second operations of the connecting step being performed in sequence.

14. The method according to claim 13, wherein said charge restoring step comprises the operations of:
    disconnecting the second side of the first switched capacitor from said first input and connecting it to said second output; and
    disconnecting the second side of the second switched capacitor from said second input and connecting it to said first output.

15. The method according to claim 10, wherein said method is provided for selectively coupling a plurality of a single-ended input analog signals to said receiving circuit and wherein said at least one input section comprises a plurality of dedicated input sections each associated to a corresponding input signal of said plurality, the method further comprising the step of selectively activating said dedicated input sections in a mutually exclusive way in order to make them cooperate, one at time, with said output section.

16. A mobile terminal comprising a circuit system according to claim 7.

* * * * *